United States Patent [19]

Penrod

[11] 4,189,085
[45] Feb. 19, 1980

[54] METHOD OF ASSEMBLING A MICROCIRCUIT WITH FACE-MOUNTED LEADS

[75] Inventor: Orville R. Penrod, Muskego, Wis.

[73] Assignee: Allen-Bradley Company, Milwaukee, Wis.

[21] Appl. No.: 895,758

[22] Filed: Apr. 12, 1978

[51] Int. Cl.² .................. B23K 1/12; H01L 21/28
[52] U.S. Cl. .......................... 228/173 R; 29/591
[58] Field of Search .......... 228/180 R, 180 A, 173 R; 29/628, 591

[56] References Cited

U.S. PATENT DOCUMENTS

| | | | |
|---|---|---|---|
| 3,417,193 | 12/1968 | Cole | 29/628 X |
| 3,474,521 | 10/1969 | Schwenn | 228/180 A |
| 4,003,125 | 1/1977 | Wallick | 29/591 X |
| 4,012,835 | 3/1977 | Wallick | 29/591 |
| 4,024,627 | 5/1977 | Stauffer | 29/591 X |
| 4,054,238 | 10/1977 | Lloyd et al. | 228/180 A X |

Primary Examiner—Francis S. Husar
Assistant Examiner—K. J. Ramsey
Attorney, Agent, or Firm—Quarles & Brady

[57] ABSTRACT

A method of assembling a packaged microcircuit with face-mounted leads includes forming a lead frame into a holder with opposed sets of leads turned upward and angular to spaced apart carrier strips, and securing a substrate having a microcircuit thereon within the holder with one set of leads securely held in contact with terminals on a face of the substrate, so that bonded electrical connections between the leads and the terminals can be readily made with conventional soldering techniques.

10 Claims, 14 Drawing Figures

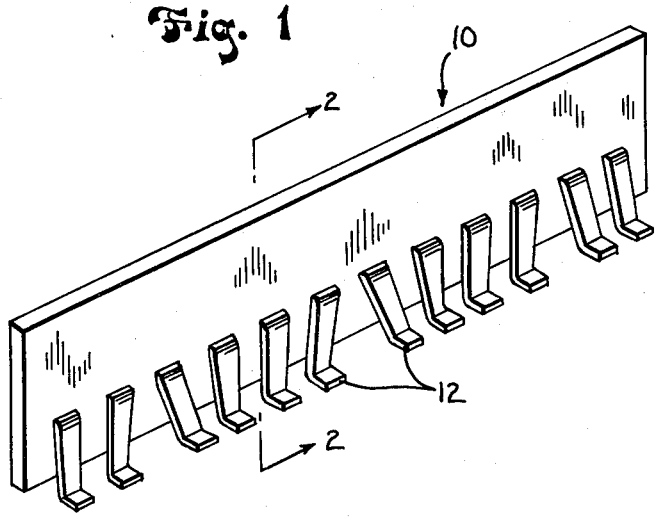
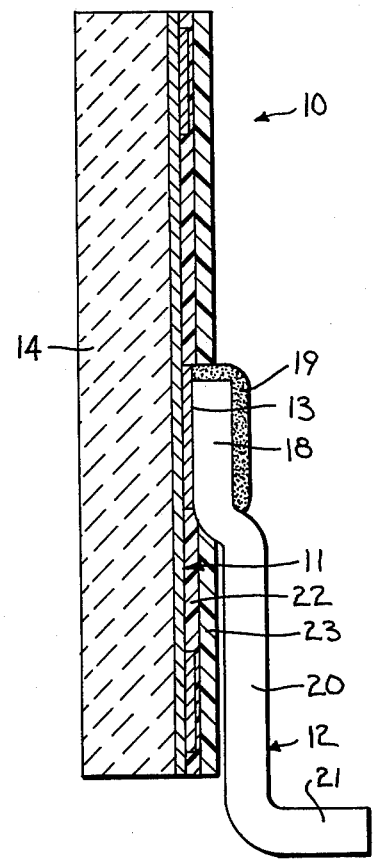
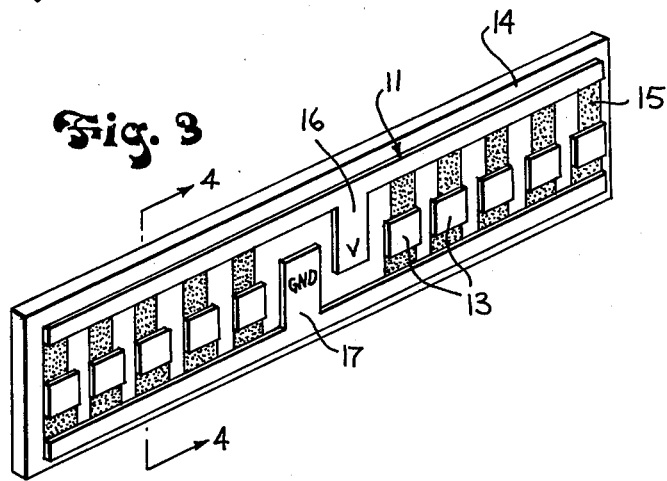
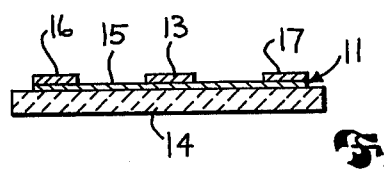
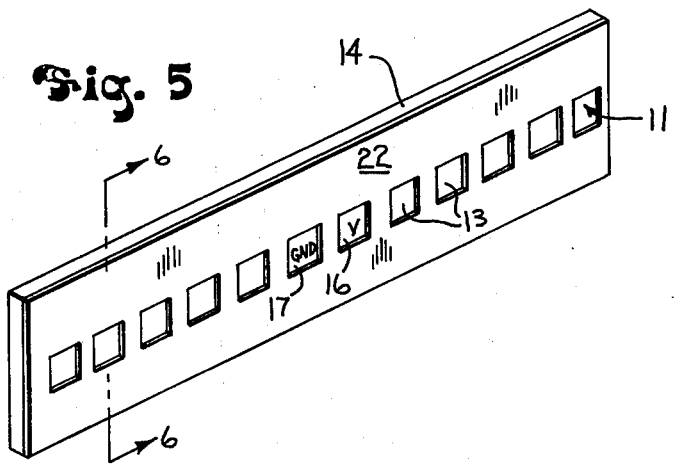
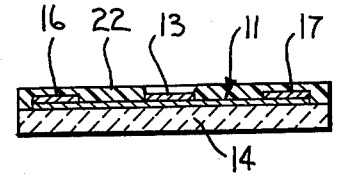

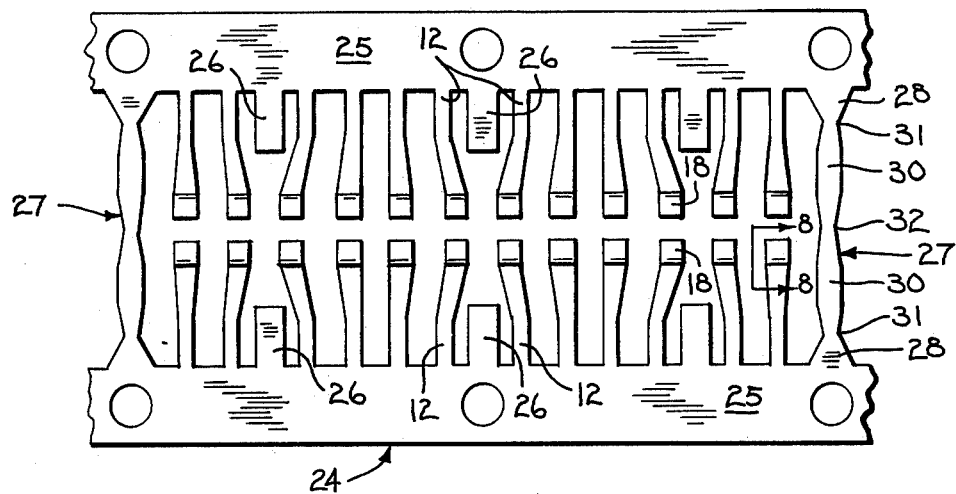
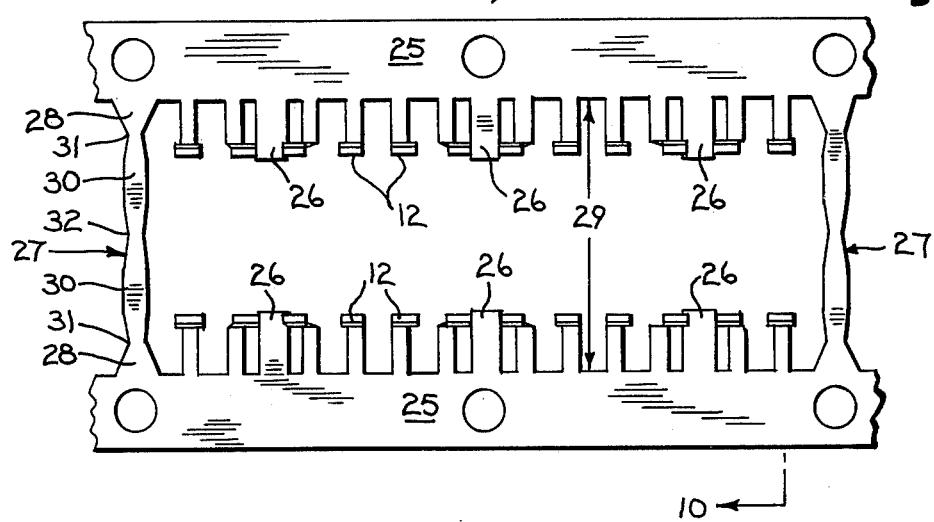
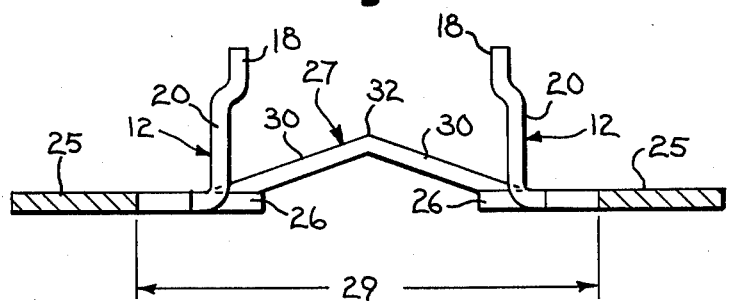

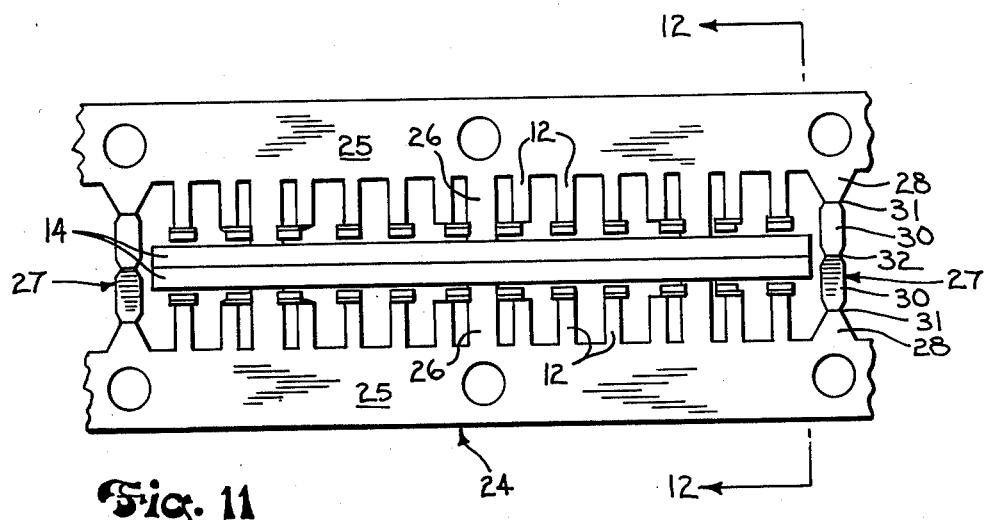
Fig. 11
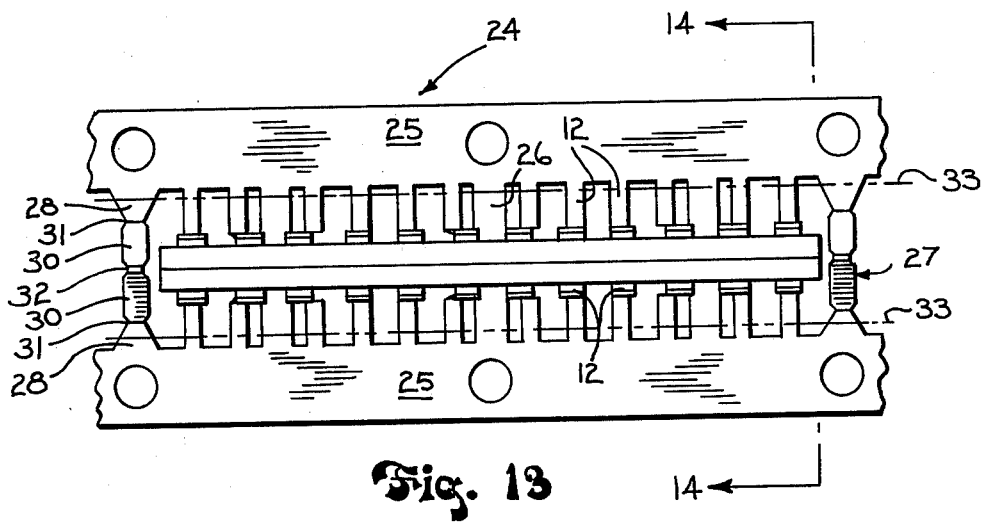
Fig. 13
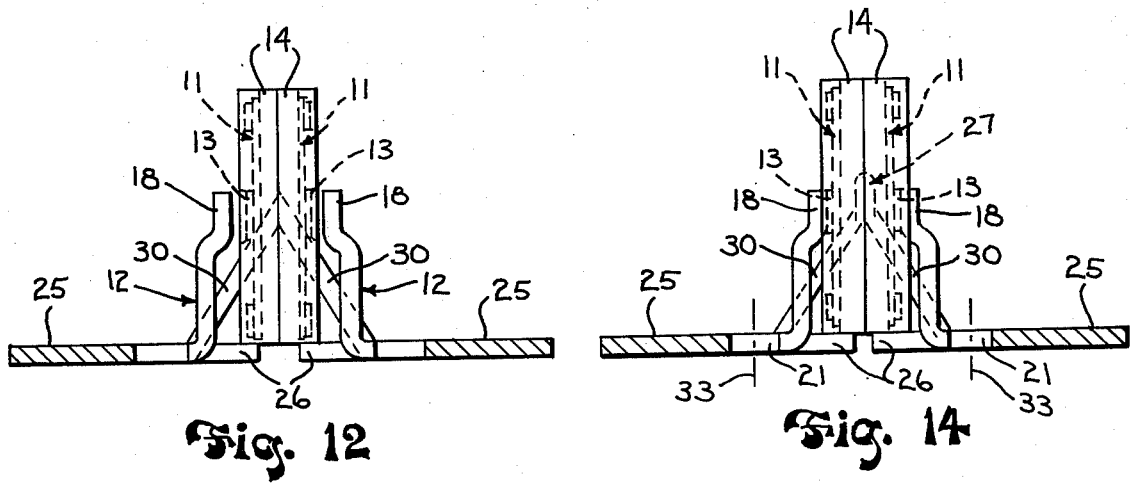
Fig. 12
Fig. 14

METHOD OF ASSEMBLING A MICROCIRCUIT WITH FACE-MOUNTED LEADS

BACKGROUND OF THE INVENTION

The invention relates to a method for readily assembling a packaged microcircuit with face-mounted leads.

In a common type of unpackaged microcircuit, circuit paths are formed on a face of a substrate and terminals are disposed along the edges of the substrate. A microcircuit of this type can be packaged in a housing and connected to leads that extend through the sides of the housing to contact its terminals. A microcircuit of this type can also be packaged without a housing, and with leads that are terminated in lead-receiving recesses along an edge of the substrate. In both styles of packaged microcircuits, the leads are inserted and seated in lead-receiving recesses before the conventional solder connections are made.

In the mass production of packaged microcircuits it has been found advantageous and economical to use lead frames. These frames carry a plurality of leads that can be inserted in sets into lead-receiving recesses in a plurality of microcircuits, simultaneously, as shown in Wallick, U.S. Pat. No. 4,012,835.

In certain types of microcircuits, circuit design has been improved by locating terminals on the face of the substrate and away from its edges. This type of microcircuit, however, is not easily packaged with existing lead frame methods. This is because the leads cannot be held down on these face terminals with the force required to insure adequate solder connections using conventional mass soldering techniques.

SUMMARY OF THE INVENTION

In the method of the present invention a microcircuit with face-mounted leads is assembled from a lead frame, having spaced apart carrier strips and electrical leads extending from at least one of the carrier strips towards another, and a microcircuit having terminals on a face of a supporting substrate. The lead frame is formed into a holder with opposed sides, at least one of the sides including leads which are angular to a respective carrier strip. The substrate is secured between the opposed sides of the holder with the terminals held securely in contact with the leads on one side, and then bonded electrical connections are formed between the leads and terminals.

It is the primary object of the invention to provide a method for mass producing microcircuits with face-mounted leads that can be electrically connected to terminals with conventional soldering techniques.

It is another object of the invention to assemble microcircuits with face-mounted leads that have projecting terminal contact surfaces and portions extending therefrom which are substantially parallel to, and yet spaced apart from, the face of the microcircuit.

It is another object of the invention to package microcircuits with a stress-inhibiting coating on the face of the microcircuit that also serves as an insulating layer between the microcircuit and the leads.

It is another object of the invention to package microcircuits using a lead frame with resilient leads that are held under tension against the terminals by moving the carrier strips towards each other.

It is another object of the invention to provide a holder for substrates which can, if necessary, be held upside down with the substrates depending therefrom for further processing such as a soldering operation or the application of a conformal coating.

It is another object of the invention to assemble pairs of packaged microcircuits in each section of the lead frame, thereby utilizing the lead frame in the most efficient manner.

Other objects and advantages of the invention will become apparent from the drawings, and the description and claims that follow.

BRIEF DESCRIPTION OF THE DRAWINGS

FIG. 1 is a perspective view of a packaged microcircuit which incorporates the present invention;

FIG. 2 is an enlarged transverse sectional view of the packaged microcircuit taken in the plane indicated by line 2—2 in FIG. 1;

FIG. 3 is a perspective view of the microcircuit of FIG. 1 before it is packaged;

FIG. 4 is a transverse sectional view of the unpackaged microcircuit taken in the plane indicated by line 4—4 in FIG. 3;

FIG. 5 is a perspective view of the microcircuit of FIG. 3 after an insulating coating has been applied;

FIG. 6 is a transverse sectional view of the coated microcircuit taken in the plane indicated by line 6—6 in FIG. 5;

FIG. 7 is a plan view of the lead frame used in making the packaged microcircuit of FIG. 1;

FIG. 8 is a transverse sectional view of a lead contact formed on the lead frame taken along the plane indicated by line 8—8 in FIG. 7;

FIG. 9 is a plan view of the lead frame of FIG. 7 with the leads bent upward and angular to the lead frame;

FIG. 10 is a transverse sectional view of the lead frame taken in the plane indicated by line 10—10 in FIG. 9;

FIG. 11 is a plan view of the lead frame of FIG. 7 after it has been partially closed to form a holder for a pair of substrates;

FIG. 12 is a transverse sectional view of the holder taken in the plane indicated by lines 12—12 in FIG. 11;

FIG. 13 is a plan view of the holder of FIG. 11 after it has been completely closed upon a pair of substrates;

FIG. 14 is a transverse sectional view of the holder taken in the plane indicated by lines 14—14 in FIG. 13.

DESCRIPTION OF THE PREFERRED EMBODIMENT

FIGS. 1 and 2 show a packaged microcircuit 10 which is difficult to produce with conventional assembly methods, but which can readily be made from the unpackaged microcircuit 11 of FIG. 3 using the method of the present invention. The packaged microcircuit 10 is a modified version of a single-in-line (SIP) packaged microcircuit in which the leads 12 are spaced apart and aligned in a row extending along the length of the microcircuit. In the standard SIP package the leads, or pins as they are sometimes called, most commonly depend from lead-receiving recesses along a bottom edge of the package. The microcircuit to be assembled with the method of the present invention has leads 12 connected to terminals 13, shown in FIGS. 2 and 3, which are formed in a longitudinal row across the midsection of one face of the microcircuit 11. Although the particular configurations for microcircuits shown in FIGS. 1 and 3 will be referred to in disclosing the invention, it will be apparent from the following description that the method of the invention can be applied in the manufacture of dual-in-line (DIP) packages, and many other microcircuit packages.

Referring to FIGS. 3 and 4, the microcircuit 11 is formed on an alumina substrate 14 having front and back faces circumscribed by planar edge surfaces. A group of parallel circuit paths 15 of a resistive material such as chromium cobalt are deposited on the front face of the substrate 14 with a thin-film technique such as vacuum deposition, which is well known in the art. The circuit paths 15 are connected together by termination buses 16, 17 which are metallized strips that extend longitudinally along the edges of the substrate 14. The microcircuit 11 is an ECL (emitter coupled logic) terminator circuit, in which it is advantageous to have one termination bus 16 available to connect all of the circuit paths 15 to a supply voltage (V), and the other termination bus 17 available to connect all of the circuit paths 15 to ground (GND). Terminals 13 are formed by metallized patches on each circuit path 15 intermediate the termination buses 16, 17. The metallized areas that form the terminals 13 and the termination buses 16, 17 are applied to the face of the substrate 14 over the circuit paths 15 with thin film vacuum evaporation techniques that are well known in the art.

The leads 12 are connected to the packaged microcircuit 10 as shown in FIG. 2. The leads 12 are flat, bent strips of metal having a projecting contact 18 near an upper end with a contact face that is held flush against a respective terminal 13 by a solder connection 19. An intermediate, shank portion 20 of the lead 12 is laterally offset from the lead contact 18 and extends along, and substantially parallel to, the face of the packaged microcircuit 10 to a foot 21 at the other end. The lead foot 21 is formed substantially at a right angle to the lead shank 20, providing both a support for the package 10 and an electrical contact at the lower end of the lead 12. The packaged microcircuit 10 also includes an inner, stress-inhibiting coating 22 and an outer, conformal coating 23, both covering the microcircuit 11.

In the preferred sequence of assembling the packaged microcircuit 10, the microcircuit 11 is first covered, except for its terminals, with a stress-inhibiting, protective coating 22 as shown in FIGS. 5 and 6. A photosensitive material is spun onto the substrate 14, and exposed to a light source through a negative mask to obtain the desired coverage of the stress-inhibiting coating 22. A suitable, photosensitive material used for this coating 22 is Polyimide P12540, which is commercially available from E. I. DuPont de Nemours & Co., Inc., Fabric and Finish Dept., Wilmington, Delaware. This coating 22 will protect the microcircuit 11 and its substrate 14 from potential stresses that might cause changes in the resistance values of the circuit paths 15.

The conformal coating 23 shown in FIG. 2 is applied to the microcircuit 11, except for its terminals 13, to protect it from the environment and insulate it from the leads 12. The step is performed with an encapsulant that can withstand soldering operations to be performed thereafter. A suitable encapsulant is A-5524 Organic Encapsulant, commercially available from Engelhard Industries, Electrometallics Division, East Newark, New Jersey. This encapsulant is screen printed over the microcircuit and allowed to cure. The conformal coating 23 may be applied using other compounds in conjunction with other methods, such as roll coating, spraying and dipping. The conformal coating 23 may also be applied after the leads 12 are soldered to the microcircuit 11, if desired.

A section of the preferred lead frame 24 which is used to mass produce packaged microcircuits 10 is shown in FIG. 7. The lead frame 24 is cut or stamped out from a sheet of 0.010 inch copper, Olin alloy 194, plated with a metal finish of sixty percent lead and forty percent tin by weight. The leads 12 are approximately b 0.02 inches in width and can be permanently deformed with conventional tools, yet are resilient in an undeformed state.

Each section of the lead frame 24 carries two sets of leads 12 extending inwardly towards each other from spaced apart carrier strips 25 that form the opposite sides of the lead frame 24. Preferably, twelve leads 12 are included in each set. The carrier strips 25 include pilot apertures for seating the lead frame 24 during assembly operations. Flat, bar-shaped arms 26 are formed on the opposed inside edges of the carrier strips 25 and extend towards each other in spaces between the leads 12. The arms 26 are shorter than the leads 12 and are spaced along the carrier strips 25 to divide each set of leads 12 into groups of two, four, four, and two along the carrier strips 25. At the ends of the opposed sets of leads 12 the carrier strips 25 are joined by collapsible rungs 27 which divide the lead frame 25 into longitudinal sections. Preferably, the lead frame 24 includes six sections of the type described. It should be obvious, however, from the remainder of the description that lead frames of many other lengths, sizes and types can also be used.

Referring to FIGS. 7 and 9, each of the collapsible rungs 27 includes a pair of relatively rigid supports 28 extending into a gap 29 in the lead frame 24 between the carrier strips 25. A pair of flat, collapsible links 30 connect the supports 28 and have tapered junctions 31 with the supports 28 for easier bending. The links 30 are bent slightly at these junctions 31, as seen in FIG. 10, to form a wide angle beneath an apex of the rung 27 at their mutual junction 32, which is also tapered for easier bending.

The lead frame 24 is subjected to a dimpling operation with the results shown in FIGS. 7 and 8. The lead frame 24 is placed over an anvil member, not shown, and struck with a die, not shown, to form contacts 18 on the free ends of the leads 12. As seen in FIG. 8 the contact surface 18 projects laterally from the shank portion 20 of the lead 12. This operation is the type which can be performed with a punch press by one skilled in the art using a die and an anvil having complementary shapes to produce lead contacts 18 of the shape shown in FIG. 8.

The leads 12 are then bent upward and substantially perpendicular to the carrier strips 25 as seen in FIGS. 9 and 10. This permanent deformation produces two opposing sets of leads 12 rising substantially perpendicular to the carrier strips 25. The two sets of arms 26 remain in the plane of the carrier strips 25 and are now closer together across the gap 29 than the contacts 18, as seen in FIG. 10. The contacts 18 on oppositely disposed leads 12 face inwardly towards each other and are closer together across the gap 29 than the lead shanks 20.

As seen in FIGS. 11 and 12 the lead frame 24 is partially closed to form a substrate holder by pushing the carrier strips 25 towards each other to narrow the angle between the links 30 and elevate the apexes of the rungs 27. This pulls the carrier strips 25 and their extending arms 26 closer together to form a supporting surface for pairs of coated microcircuits 11, which are placed with their substrates 14 on edge and back-to-back in the sections of the holder as shown in FIG. 12. The microcircuit 11 on each substrate 14 faces outwardly towards the leads 12 on the adjacent carrier strip 25 with its terminals 13 aligned with the projecting lead contacts 18. The length of the leads 12 corresponds to the height of the terminals 13 when a substrate 14 is placed on edge on the carrier strip arms 26 as shown in FIG. 12.

The carrier strips 25 are then pushed still closer together to the position shown in FIGS. 13 and 14. This further collapses the links 30 together and presses the lead contacts 18 against the terminals 13 on the opposing faces of the two substrates 14 in each section of the holder. The resilient leads 12 act as leaf spring members which are put under tension by this action to securely hold the substrates 14. The links 30 are then crimped at the apexes of the rungs 27, to maintain the leaf spring assembly upon removal of the forces urging the carrier strips 25.

Next, solder connections are formed between the leads 12 and the terminals 13 preferably by passing the microcircuits 11 and attached holder through a solder wave or reflow furnace. Solder adheres to the metallized terminals 13 but not to the coated surfaces. The holder may be inverted, thereby allowing the microcircuits 11 to be only partially immersed in solder to the depth necessary to make electrical connections at the terminals 13. In some embodiments it may also be desirable to apply the conformal coating 23 after soldering, and to take advantage of the attached holder by dipping the assembly in the encapsulant.

Finally, the parts of lead frame 24 supporting the leads 12 are removed by severing the leads 12 along a cut line 33 marked in FIGS. 13 and 14. The deformed links 30 and carrier strip arms 26 are severed as well, and separated from the packaged microcircuits 10 with the other lead frame scraps. With the carrier strips 25 and arms 26 removed from the assembly in FIG. 14, the feet 21 of the leads 12 extend below the edges of the substrate 14 as shown in FIG. 2.

A large number of packaged microcircuits can be manufactured with this method by using lead frames with multiple sections, and by continuously feeding these lead frames and a supply of unpackaged microcircuits into apparatus adapted for closing the lead frames as described herein. This method can be used wherever it is desired to mount leads on a flat surface, even if that surface is in the bottom of an open depression. While it is more efficient to assemble a pair of SIP packaged microcircuits in each section of the lead frame, an individual SIP packaged microcircuit can also be assembled in each section of the lead frame. Symmetry of the lead frame and holder is preferred but not required. The method of the invention can also be used to manufacture dual-in-line (DIP) packages by attaching oppositely disposed sets of leads to terminals on oppositely facing surfaces of a single substrate.

Thus, while a preferred method of assembling microcircuits has been described, it should be apparent that certain variations in the method can be made without departing from the fundamental principles of the invention. Therefore, the scope of the invention shall be defined by the following claims.

I claim:

1. A method of attaching leads to terminals of a microcircuit supported on a face of a substrate, comprising the steps of:

forming a lead frame, having spaced apart carrier strips and electrical leads extending from at least one carrier strip towards another, into a holder with opposed sides, at least one side including leads which are angular to a respective carrier strip, wherein the forming step includes moving the carrier strips closer together to adapt the lead frame to support the substrate;

securing the substrate between opposed sides of the holder with the terminals held securely in contact with the leads on one side; and forming bonded electrical connections between the terminals and the leads in contact therewith.

2. A method of attaching leads to terminals of a microcircuit supported on a face of a substrate, comprising the steps of:

forming a lead frame, having spaced apart carrier strips and electrical leads extending from at least one carrier strip towards another, into a holder with opposed sides, at least one side including leads which are angular to a respective carrier strip;

disposing the substrate in the holder between its opposed sides with the terminals facing and aligned with the leads on one side;

moving the carrier strips towards each other until the terminals are securely held in contact with the leads aligned therewith; and forming bonded electrical connections between the terminals and the leads in contact therewith.

3. A method of assembling a packaged microcircuit from a lead frame having sets of electrical leads extending towards each other from spaced apart carrier strips, and a microcircuit with terminals on an outer surface of a supporting substrate, comprising the steps of:

forming the lead frame into a holder with opposed sets of leads angular to the carrier strips;

supporting the substrate on edge in the holder with the terminals facing and aligned with the leads in one of the sets;

moving the carrier strips towards each other until the terminals are securely held in contact with the leads aligned therewith; and forming bonded electrical connections between the terminals and the leads in contact therewith.

4. The method of claim 3, further comprising the step of applying a stress-inhibiting coating to the microcircuit.

5. The method of claim 3, wherein the carrier strips have arms extending from opposed inside edges between the leads, and wherein the holder is formed by bending the leads angular to the carrier strips, and by moving the carrier strips closer to each other to form a supporting surface between the sets of leads.

6. The method of claim 3 wherein the lead frame includes resilient leads, and wherein the leads are pressed into contact with the terminals and put in tension by the movement of the carrier strips.

7. The method of claim 3, further comprising the step of forming projecting contact surfaces on the leads to contact the terminals and hold the remaining portions of the leads off the face of the microcircuit.

8. A method of assembling a plurality of packaged microcircuits with face-mounted leads from a lead frame having sets of electrical leads extending towards each other from spaced apart carrier strips, and a plurality of substrates each having a microcircuit with terminals formed on an outer surface of the substrate, comprising the steps of:

forming the lead frame into a holder with opposed sets of leads angular to the carrier strips;

supporting a pair of the substrates on edge and back-to-back in the holder, with the terminals on each substrate facing and aligned with leads in one of the sets;

moving the carrier strips towards each other to grip the terminals with the leads aligned therewith; and forming bonded electrical connections between the terminals and the leads in contact therewith.

9. A method of assembling a packaged microcircuit with face-mounted leads from a lead frame having sets of leads extending towards each other from spaced apart carrier strips that are joined by collapsible rungs and have arms extending from opposed inside edges between the leads, and a substrate having a microcircuit with terminals formed on a face thereof, comprising the steps of:

forming the lead frame into a holder by bending opposed sets of leads angular to the carrier strips and moving the carrier strips closer together to partially collapse the rungs therebetween;

supporting a substrate on the carrier strip arms with the terminals facing and aligned with the leads in one of the sets;

moving the carrier strips still closer together to further collapse the rungs and grip the terminals with the leads aligned therewith;

deforming the rungs to maintain the position of the carrier strips and the grip of the leads upon the terminals; and forming bonded electrical connections between the terminals and the leads in contact therewith.

10. The method of claim 9 wherein soldered electrical connections are formed between the terminals and the leads.

* * * * *